United States Patent
Lovegren

(10) Patent No.: US 11,079,268 B2
(45) Date of Patent: Aug. 3, 2021

(54) PRECISION ADC SAMPLING CLOCK FOR HIGH ACCURACY WIRELESS GUIDED WAVE RADAR

(71) Applicant: Rosemount Inc., Shakopee, MN (US)

(72) Inventor: Eric Russell Lovegren, Monticello, MN (US)

(73) Assignee: ROSEMOUNT INC., Shakopee, MN (US)

( * ) Notice: Subject to any disclaimer, the term of this patent is extended or adjusted under 35 U.S.C. 154(b) by 604 days.

(21) Appl. No.: 15/850,312

(22) Filed: Dec. 21, 2017

(65) Prior Publication Data

US 2019/0195674 A1 Jun. 27, 2019

(51) Int. Cl.
| | |
|---|---|
| *G01F 23/284* | (2006.01) |
| *G01S 13/88* | (2006.01) |
| *G01S 7/285* | (2006.01) |
| *G01S 13/10* | (2006.01) |
| *H03M 1/12* | (2006.01) |

(52) U.S. Cl.
CPC ............ *G01F 23/284* (2013.01); *G01S 7/285* (2013.01); *G01S 13/103* (2013.01); *G01S 13/88* (2013.01); *H03M 1/1245* (2013.01)

(58) Field of Classification Search
CPC ........ G01F 23/284; G01S 7/285; G01S 13/88; G01S 13/08–40; H03M 1/1245
See application file for complete search history.

(56) References Cited

U.S. PATENT DOCUMENTS

| | | | |
|---|---|---|---|
| 5,609,059 | A | 3/1997 | McEwan |
| 6,087,978 | A | 7/2000 | Lalla et al. |
| 6,300,897 | B1 | 10/2001 | Kielb |
| 6,691,570 | B1 | 2/2004 | Neuhaus et al. |
| RE40,128 | E | 3/2008 | Kielb |
| 2002/0075976 | A1 | 6/2002 | Richards et al. |
| 2003/0146867 | A1 | 8/2003 | Kornle et al. |

(Continued)

FOREIGN PATENT DOCUMENTS

| | | |
|---|---|---|
| CN | 105157789 | 12/2015 |
| CN | 107270999 | 10/2017 |

(Continued)

OTHER PUBLICATIONS

Digilent, "Counter and Clock Divider". <https://web.archive.org/web/20160913200033/https://reference.digilentinc.com/learn/programmable-logic/tutorials/counter-and-clock-divider/start> Published at least as of Sep. 13, 2016. (Year: 2016).*

(Continued)

*Primary Examiner* — Matthew M Barker

(74) *Attorney, Agent, or Firm* — Westman, Champlin & Koehler, P.A.

(57) ABSTRACT

A level transmitter includes an analog-to-digital convertor clock signal generator that receives a transmitter clock signal that is used to establish when an incident signal is transmitted toward a material boundary. The analog-to-digital convertor clock signal generator uses the received transmitter clock signal to generate an analog-to-digital convertor clock signal. An analog-to-digital convertor samples an analog waveform based on the analog-to-digital convertor clock signal and generates a digital value for each sample of the analog waveform. An analysis module analyzes the digital values to determine a distance to the material boundary.

8 Claims, 7 Drawing Sheets

(56) References Cited

U.S. PATENT DOCUMENTS

| | | | |
|---|---|---|---|
| 2004/0066324 A1 | 4/2004 | Haynes | |
| 2007/0101810 A1 | 5/2007 | Eriksson et al. | |
| 2010/0265118 A1* | 10/2010 | Merli | G01S 7/4021 342/27 |
| 2013/0099959 A1* | 4/2013 | Matsuo | G01S 7/282 342/189 |
| 2013/0214963 A1* | 8/2013 | Vacanti | G01S 13/882 342/120 |
| 2015/0084808 A1* | 3/2015 | Vacanti | G01S 13/02 342/122 |
| 2015/0153445 A1* | 6/2015 | Jansen | G01S 7/032 701/93 |
| 2016/0131740 A1* | 5/2016 | Yoo | G01S 7/4004 342/70 |
| 2016/0209260 A1* | 7/2016 | Rice | G01S 7/003 |
| 2019/0052281 A1* | 2/2019 | Thompson | H04L 27/066 |
| 2019/0195674 A1 | 6/2019 | Lovegren | |
| 2019/0271765 A1* | 9/2019 | Ben Khadhra | G01S 7/412 |

FOREIGN PATENT DOCUMENTS

| | | |
|---|---|---|
| CN | 208595946 | 3/2019 |
| DE | 100 34 875 | 2/2002 |
| DE | 10 2015 120 362 | 6/2017 |
| EP | 2 199 762 | 6/2010 |
| JP | 3429480 B2 | 5/2003 |
| JP | 4651251 B2 | 12/2010 |
| JP | 2014-2090 A | 1/2014 |
| JP | 5773951 B2 | 7/2015 |
| WO | WO 2014/009068 | 1/2014 |

OTHER PUBLICATIONS

Office Action from Chinese Patent Application No. 201810397531.7, dated Mar. 26, 2020.
Second Office Action from Chinese Patent Application No. 201810397531.7, dated Sep. 7, 2020.
Office Action from European Patent Application No. 18778627.2, dated Jul. 28, 2020.
Notification of Transmittal of the International Search Report and the Written Opinion of the International Searching Authority from International Application No. PCT/US2018/048736, dated Nov. 26, 2018.
Third Office Action from Chinese Patent Application No. 201810397531.7, dated Feb. 22, 2021.
Rejection Notice for Japanese Patent Application No. 2020-533724, dated May 12, 2021, 6 pages.

* cited by examiner

PRECISION ADC SAMPLING CLOCK FOR HIGH ACCURACY WIRELESS GUIDED WAVE RADAR

FIELD

Embodiments described below relate to transmitters used in the process control industry to measure levels of materials. More particularly, the embodiments relate to level transmitters that are capable of detecting material interfaces that are separated by a small distance.

BACKGROUND

Level transmitters are used in the process control industry to provide a value representing the level or height of a material boundary. Examples of such material boundaries include liquid/gas boundaries, semi-liquid/gas boundaries, liquid/semi-liquid boundaries and liquid/liquid boundaries. To identify the height of such boundaries, a transceiver in the level transmitter is used to direct an incident electromagnetic signal toward the boundary from a position somewhere above the boundary. The transceiver then detects a reflected electromagnetic signal that is created when a portion of the incident electromagnetic signal reflects off of the boundary. The time between the issuance of the incident signal and the reception of the reflected signal is then used to determine the distance between the transceiver of the level transmitter and the material boundary.

One class of level transmitters are those based on time domain reflectometry (TDR). In TDR, low power nanosecond pulses are guided along a probe submerged in the process media. When a pulse reaches the surface of the material it is measuring, part of the energy is reflected back to the transmitter and the time difference between the generated and reflected pulse is converted into a distance that indicates the level of the material boundary/surface.

SUMMARY

A level transmitter includes an analog-to-digital converter clock signal generator that receives a transmitter clock signal that is used to establish when an incident signal is transmitted toward a material boundary. The analog-to-digital converter clock signal generator uses the received transmitter clock signal to generate an analog-to-digital converter clock signal. An analog-to-digital converter samples an analog waveform based on the analog-to-digital converter clock signal and generates a digital value for each sample of the analog waveform. An analysis module analyzes the digital values to determine a distance to the material boundary.

In accordance with a further embodiment, a method includes directing a series of incident signals toward a material beginning at a start time and generating a second signal that designates a time for converting an analog waveform representing reflected signals from the material into a digital value. The second signals are generated such that the time for converting occurs an amount of time after the start time and such that the amount of time is independent of variations in interrupt handling.

A level transmitter includes an incident signal generator that transmits an incident signal toward a material and a dedicated analog-to-digital converter clock generator that generates an analog-to-digital converter clock signal. A receiver receives a reflected signal from the material and generates an analog signal from the reflected signal. An analog-to-digital converter, which receives the analog-to-digital converter clock signal, produces digital samples of the analog signal based on the analog-to-digital converter clock signal.

DETAILED DESCRIPTION OF ILLUSTRATIVE EMBODIMENTS

Figure 1:
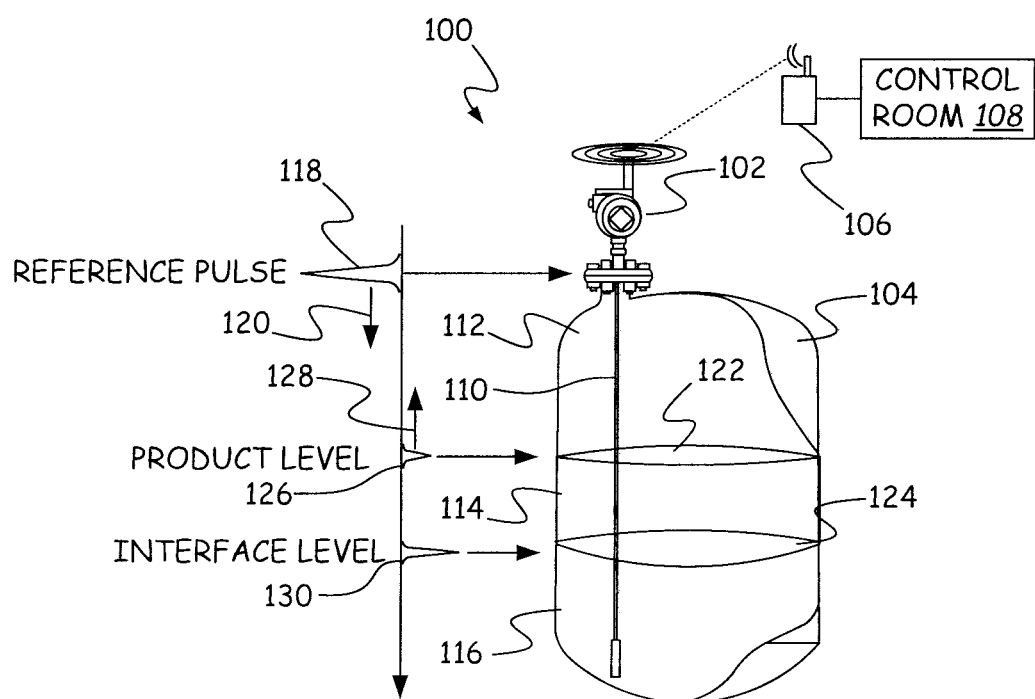
FIG. 1 is a diagram of a process control system in accordance with one embodiment.

FIG. 1 provides a diagram of a process control system 100 that includes a wireless level transmitter 102 mounted on a material tank 104 and providing one or more process variables wirelessly to a wireless receiver 106, which conveys the process variables to one or more computing devices in a control room 108. In system 100, level transmitter 102 is a time domain reflectometry level transmitter which includes a probe 110 that extends in tank 104 through a gas region 112 and one or more liquid and/or semi-liquid material layers, such as material layers 114 and 116. A transceiver in level transmitter 102 generates an incident or reference pulse 118 in a direction 120 toward the materials in tank 104. At each material boundary layer, such as boundary layer 122 and boundary layer 124, a portion of the incident pulse is reflected back toward the transceiver of level transmitter 102. For example, at boundary 122, a reflected pulse 126 is produced and travels in direction 128 back toward level transmitter 102 and at boundary 124, a reflected pulse 130 is produced that also travels in direction 128 toward level transmitter 102.

The amount of time it takes for reference pulse 118 to reach a boundary and be partially reflected back to the transceiver can be used to calculate a distance from the transceiver to the boundary layer. The accuracy of the distance measurement is therefore dependent upon the accuracy of the timing measurement. In particular, inconsistencies in measuring when the reflected pulse reaches the transceiver relative to when the incident pulse left the transceiver limit the achievable accuracy of the level transmitter.

Figure 2:
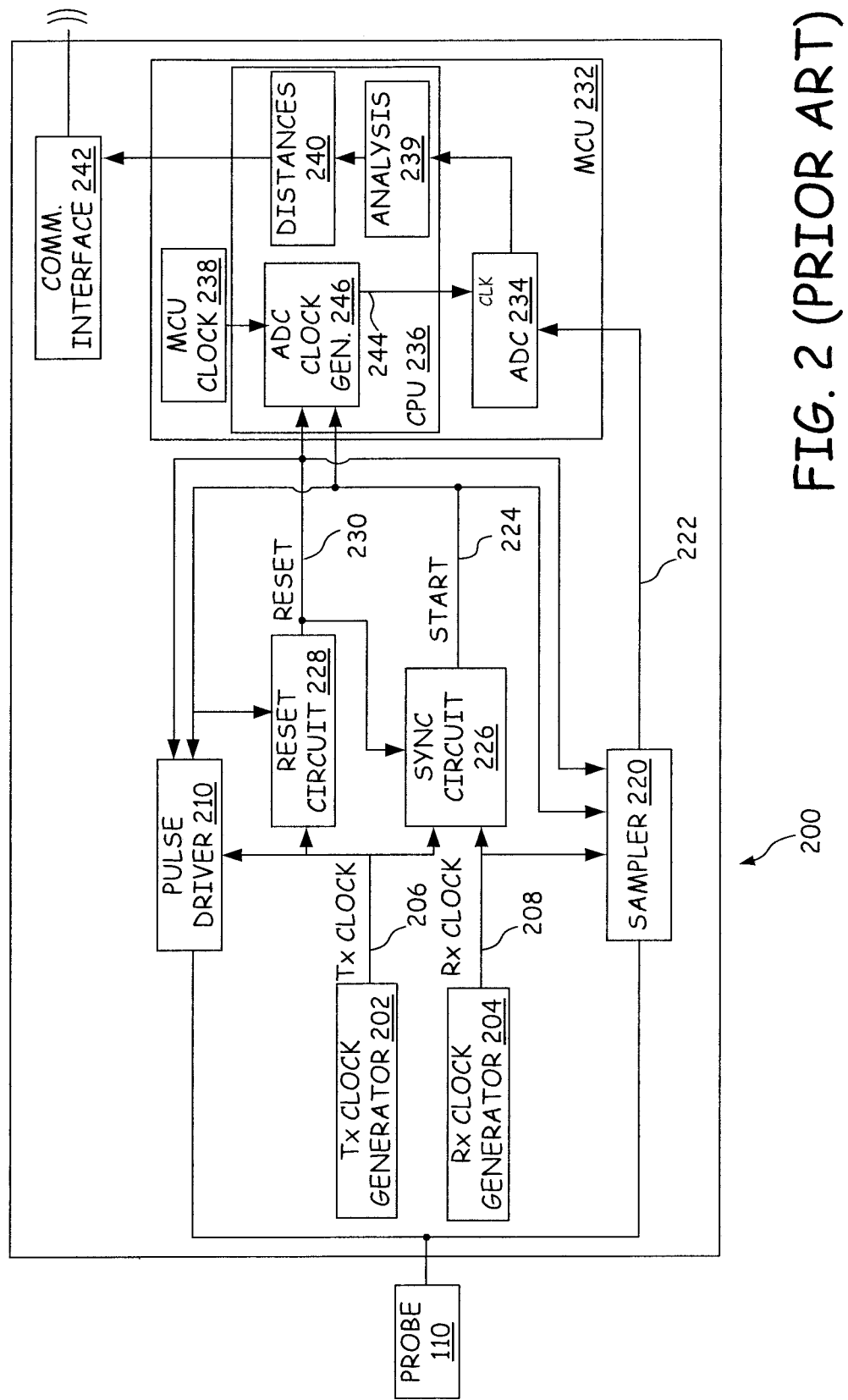
FIG. 2 is a block diagram of a prior art level transmitter.

FIG. 2 provides a block diagram of a level transmitter 200 of the prior art. Level transmitter 200 includes a transmitter clock generator 202, which produces a transmitter clock signal 206 and a receiver clock generator 204, which produces a receiver clock signal 208. In accordance with some embodiments, receiver clock generator 204 forms receiver clock signal 208 so that receiver clock signal 208 sweeps through a plurality of phase delays relative to transmitter clock signal 206. A sync circuit 226 causes a START signal to transition when transmitter clock signal 206 and receiver clock signal 208 are in phase. START signal 224 is provided to a pulse driver (also referred to as an incident signal generator) 210 and a sampler 220 such that when START signal 224 transitions, pulse driver 210 begins issuing a series of pulses on probe 110 in phase with transmitter clock signal 206 and sampler 220 begins forming a time equivalent signal 222 of reflected signals from probe 110.

In particular, pulse driver 210 generates a fast rising pulse with each cycle of transmitter clock signal 206. Each pulse is directed to and travels down probe 110 and is partially reflected by one or more material boundaries. Sampler 220 receives the reflected signals and uses receiver clock signal 208 and an internal sample and hold circuit to sample different phases of the reflected signals relative to the incident pulse signal. By sampling different reflected signals at different phases, sampler 220 is able to construct equivalent-time analog signal 222, which is a reconstruction of the reflected signals along a longer time scale than the reflected signals. By forming this equivalent time waveform, the sampling rate of the analog to digital converter can be much slower than the transmitter clock signal. Since the accuracy of the level transmitter is based in part on the frequency of the transmitter clock signal, with higher frequencies resulting in higher accuracy, sampler 220 allows for higher accuracy in the level transmitter while still permitting analog to digital conversion of the reflected waves at a reasonable sampling rate for analog-to-digital converters.

START signal 224 is also provided to a reset circuit 228, which counts transitions on transmitter clock signal 206 after START signal 224 transitions and transitions a RESET signal 230 after a desired number of cycles of transmitter clock signal 206. RESET signal 230 is provided to pulse driver 210 such that the transition in RESET signal 230 causes pulse driver 210 to stop issuing pulses. RESET signal 230 is also provided to sampler 220 and sync circuit 226 causing sampler 220 to stop sampling when RESET signal 230 transitions and causing START signal 224 to be reset.

Under the prior art, a microcontroller unit (MCU) 232, which includes an analog-to-digital converter 234, a central processing unit (CPU) 236 and a microcontroller unit clock 238, receives time equivalent signal 222 from sampler 220 and uses time equivalent signal 222 to generate distances 240 to one or more material boundaries. Specifically, analog-to-digital converter 234 samples time equivalent signal 222 at time points determined from an analog-to-digital converter (ADC) clock signal 244 to generate a series of digital values. The series of digital values are provided to analysis firmware 239, which is implemented by CPU 236. Analysis firmware 239 identifies peaks in the series of digital values and determines the length of time between when the incident pulse was sent and when each peak occurred in the reflected signal. Analysis firmware 239 then uses these times to calculate distances 240 to one or more material boundaries.

Under the prior art, ADC clock signal 244 is generated by ADC clock generator 246, which is firmware executed by CPU 236. ADC clock generator 246 starts ADC clock signal 244 after receiving START signal 224 and stops ADC clock signal 244 after receiving RESET signal 230. The transitions in ADC clock signal 244 are generally in phase with MCU clock 238.

Microcontroller unit 232 receives RESET signal 230 and START signal 224 on respective I/O ports, which microcontroller unit 232 monitors for changes. When either of these signals changes, an interrupt is issued to CPU 236 that causes CPU 236 to suspend its current activities, save its state, and begin executing ADC clock generator firmware 246 to handle the new signal value. Because it takes time for the CPU to switch from the code it was executing to ADC clock generator 246, there is a delay or latency between when START signal 224 transitions and when the ADC clock signal 244 begins. In addition, this delay is variable because of variations in the interrupt handling that can occur based on other signals that the microcontroller unit 232 is receiving and other firmware that CPU 236 is processing. In addition, this delay can vary due to DMA versus CPU bus priorities.

Figure 3:
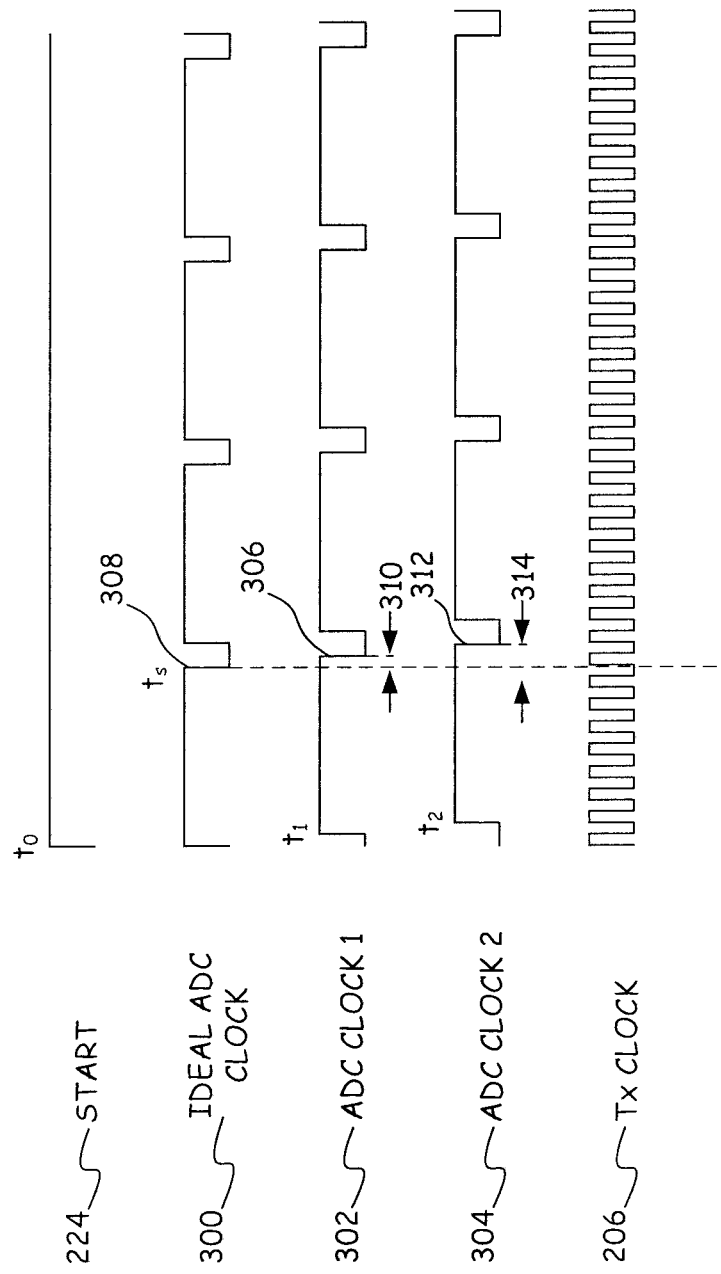
FIG. 3 is a timing graph of signals in the prior art level transmitter of FIG. 2

FIG. 3 shows a timing diagram of the level transmitter 200 of the prior art showing the variations in the ADC clock signal. As shown in FIG. 3, START signal 224 transitions at time $t_0$. An ideal analog to digital converter clock signal 300 would start simultaneously with START signal 224 at time $t_0$. The ideal analog to digital converter clock signal 300 would then have an ideal sampling time, $t_s$, at 308.

Due to the variations in interrupt handling within microcontroller unit 232, ADC clock signal 244 is not ideal but instead may produce inconsistent clock signals as shown by example ADC clock signals 302 and 304. ADC clock signal 302 is shown to start at a time $t_1$ after START time $t_0$ and ADC clock signal 304 is shown to start at an even later time $t_2$ after START time $t_0$. Because of the delay in starting ADC clock signal 302, the sampling time 306 in clock signal 302 is delayed by a time 310 relative to ideal sampling time $t_s$. For clock signal 304, the sampling time 312 is delayed by a time 314 after the ideal sampling time $t_s$. Thus, the variability in starting the ADC clock signal after a transition in START signal 224 results in a variation of when digital samples are formed from time equivalent signal 222. The amount of variation in the starting of the ADC clock signal is unpredictable and as a result lowers the achievable accuracy of the level transmitter.

Figure 4:
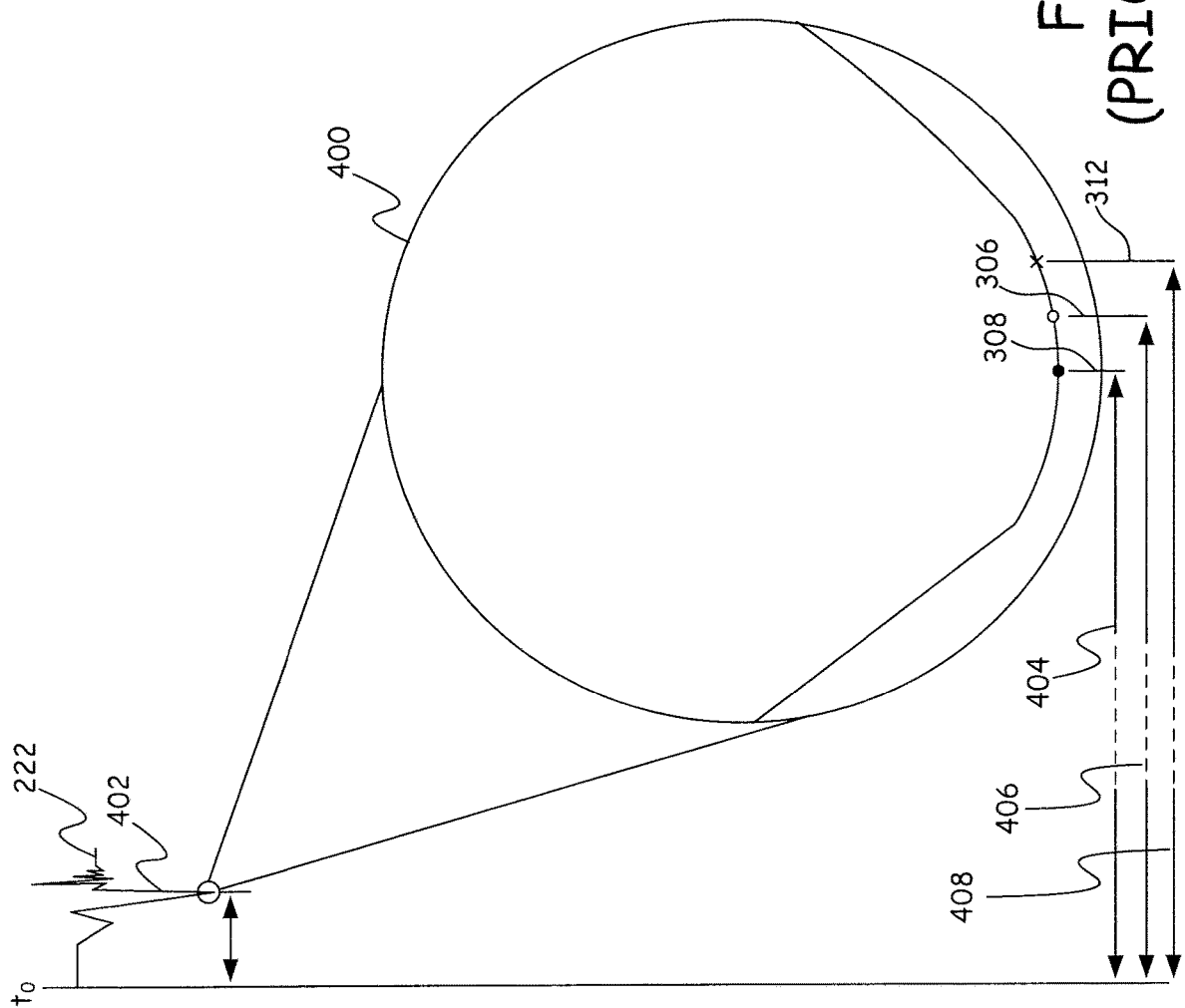
FIG. 4 is a graph showing sampling of reflected signals in the prior art level transmitter of FIG. 2.

This loss in accuracy can be seen in the graph of FIG. 4, which shows a time equivalent signal 222 relative to a transition in start signal 224, $t_0$. As shown in the exploded region 400, the bottom of a pulse 402 is identified as occurring after an amount of time 404 at sampling time 308 but is determined to occur at a time 406 for sampling time 306 and at a time 408 at sampling time 312. Since the increased time for the later sampling points directly corresponds to the calculation of a further distance to the material boundary, the variations in the starting of ADC clock signal 244 found in the prior art may result in variations in the measured distances.

In addition to the variations in the sampling time caused by variations in starting the ADC clock signal, the prior art also introduces variations in the sampling times due to phase jitter between MCU clock signal 238 and transmitter clock signal 206. As shown in FIG. 3, the ideal sampling time $t_s$ is aligned with a transition in transmitter clock signal 206. However, sampling times 306 and 312 do not align with the transition in transmitter clock signal 206. Since the phase relationship between MCU clock 238 and transmitter clock signal 206 is unpredictable, the resulting timing variations and associated distance variations cannot be predicted and may lead to a loss in accuracy in the distance calculations.

Figure 5:
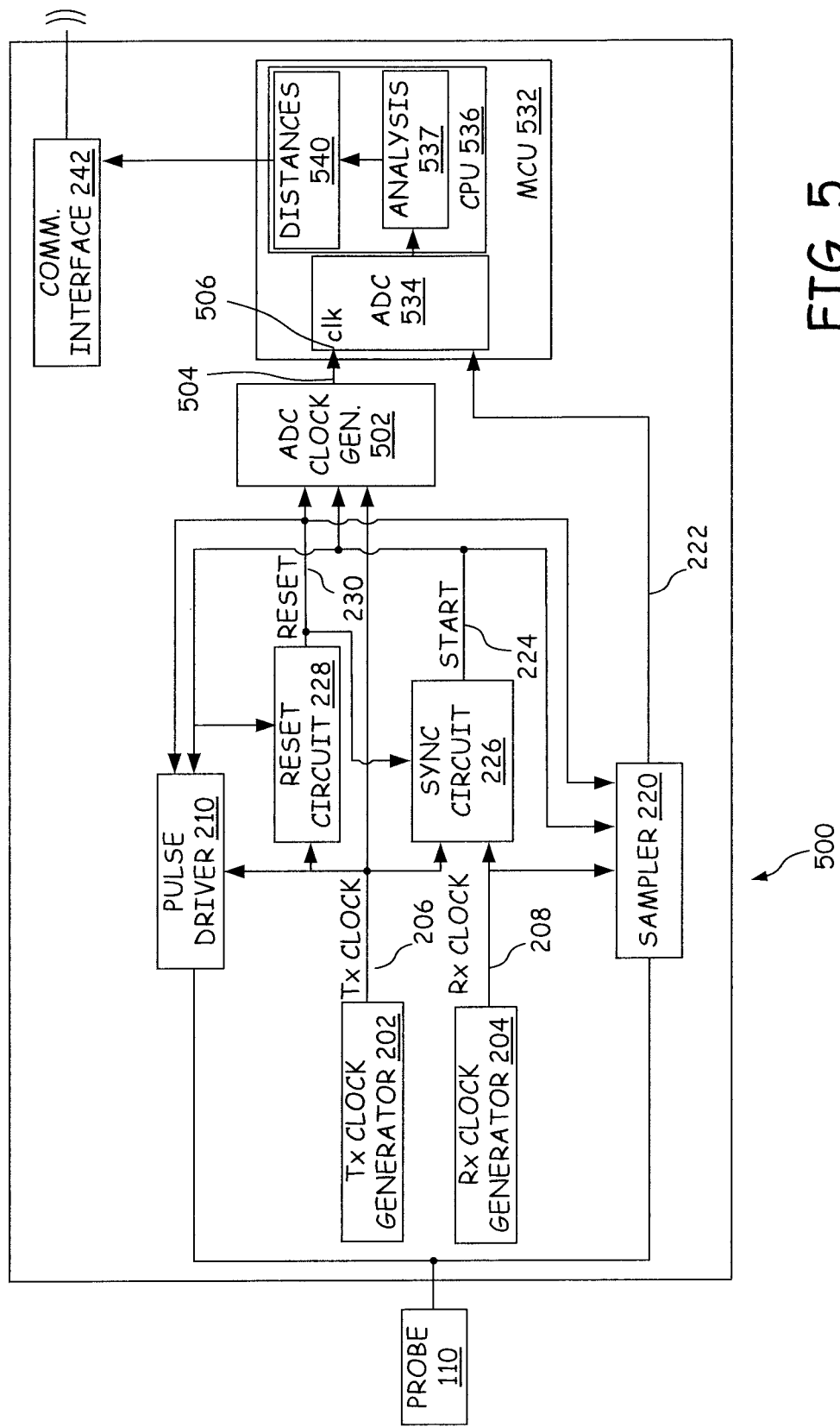
FIG. 5 is a block diagram of a level transmitter in accordance with one embodiment.

FIG. 5 provides an example of a level transmitter 500 in accordance with one embodiment. In level transmitter 500, transmitter clock generator 202, receiver clock generator 204, sync circuit 226, reset circuit 228, pulse driver 210 and sampler 220 operate in an identical manner to the manner described above for level transmitter 200.

In level transmitter 500, instead of using firmware in CPU 236 of microcontroller unit 232 to generate the ADC clock signal, level transmitter 500 uses a dedicated hardware ADC clock generator 502 to generate an ADC clock signal 504, which is fed to a clock input 506 of an analog-to-digital converter (ADC) 534 in microcontroller unit 532. ADC 534 receives time equivalent signal 222 and samples time equivalent signal 222 to generate digital values based on transitions in ADC clock signal 504. These digital samples are provided to analysis firmware 537 executed by central processing unit 536 in microcontroller unit 532. Analysis firmware 537 uses the digital samples to identify reflected pulses in time equivalent signal 222 and the expected timing of such pulses to determine distances 540 for one or more material boundaries. Distances 540 are then provided to communication interface 242 for transmission to devices in a control room or other processing devices such as other process transmitters.

Figure 6:
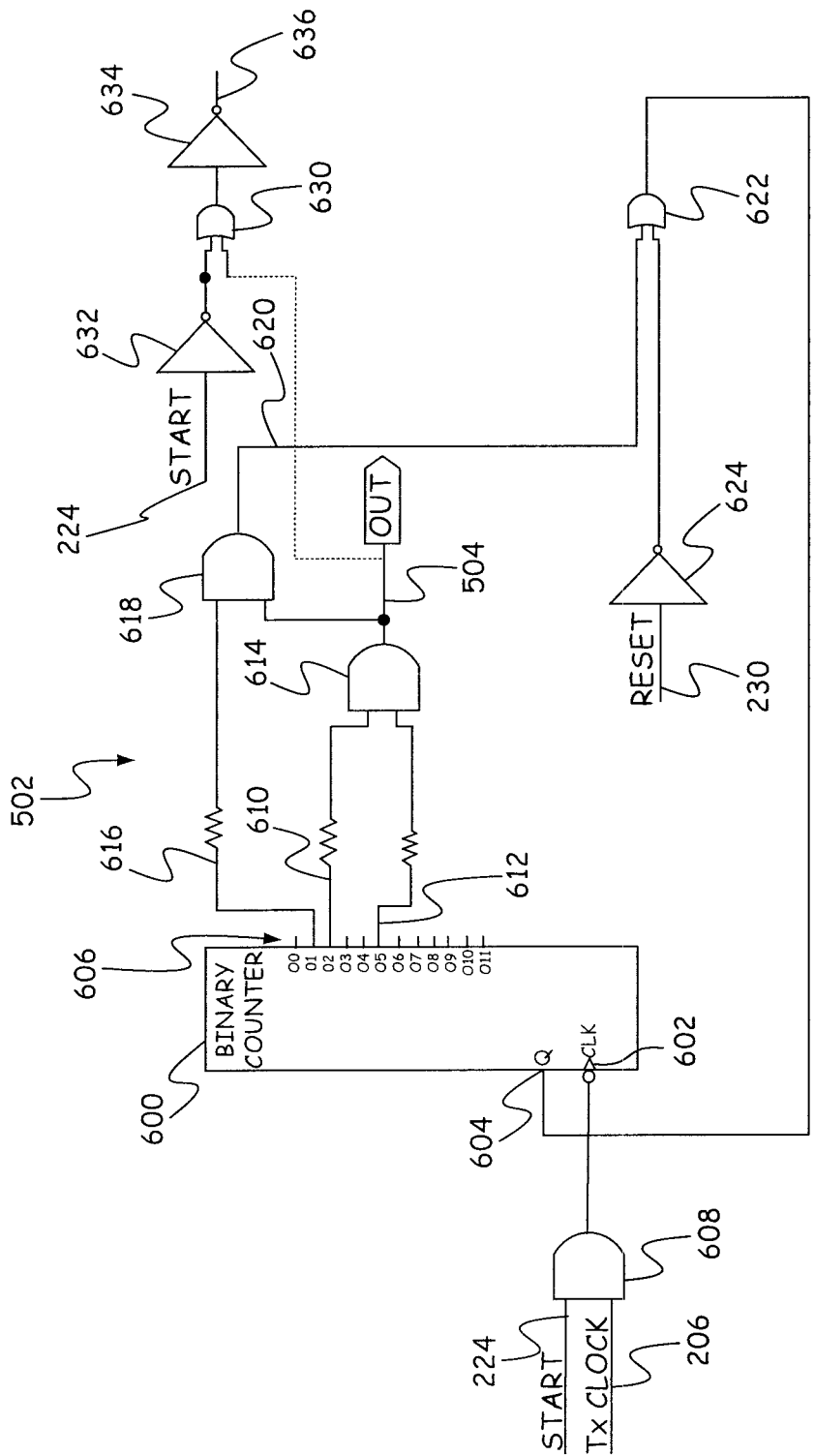
FIG. 6 is a circuit diagram of an analog-to-digital converter clock generator in accordance with one embodiment.

FIG. 6 provides a circuit diagram of one embodiment of ADC clock generator 502. ADC clock generator 502 includes a binary counter 600 with a clock input 602, a reset input 604 and count outputs 606. Each of count outputs 606 represents a separate bit in a multi-bit digital value. As a result, different combinations of outputs 606 represent different counts.

Clock input 602 receives the output of an AND gate 608 that receives transmitter clock signal 206 and START signal 224. Transmitter clock signal 206 is a continuous signal while START signal 224 is low for some time before the transmitter clock 206 comes into phase with receiver clock 208, at which point START signal 224 transitions to high. Thus, before START signal 224 transitions, clock input 602 of counter 600 receives a steady-state low value, such that counter 600 does not increment its count. As soon as START signal 224 transitions to high, a delayed version of transmitter clock signal 206 is applied to clock input 602, where the delay is due to the small delay present in AND gate 608. At steady-state temperatures, the delay in AND gate 608 is consistent over time. Thus, after START signal 224 transitions to high, clock input 602 of counter 600 tracks transmitter clock signal 206.

Two output pins 610 and 612 from counter 600 are applied through respective resistors to inputs of a second AND gate 614, which has an output representing ADC clock signal 504. Thus, ADC clock signal 504 will be low until binary counter 600 reaches a count that causes both of output pins 610 and 612 to transition to high, at which point ADC clock signal 504 will transition to high. Because binary counter 600 receives a delayed version of transmitter clock signal 206 at clock input 602, the transition in ADC clock signal 504 from low to high is caused by a transition in transmitter clock signal 206. Specifically, it is the transition in transmitter clock signal 206 that causes binary counter 600 to increment its count thereby causing the transition in output pin 610 from low to high that causes ADC clock signal 504 to transition from low to high.

ADC clock signal 504 will remain high for a hold time. In the embodiment of FIG. 6, this hold time is controlled by output pin 616 and ADC clock signal 504, which are input to AND gate 618. When binary counter 600 reaches a count that causes output pin 616 and ADC clock signal 504 to be high, output 620 of AND gate 618 transitions from low to high. In the example of FIG. 6, this occurs two counts after ADC clock signal 504 transitions to high. Output 620 of AND gate 618 is provided to an OR gate 622 that has its output tied to reset input 604 of counter 600. Thus, when the counter causes output pins 610, 612 and 616 to be high, the output of OR gate 622 and reset input 604 of counter 600 transition to high, causing binary counter 600 to reset. This reset causes all of the output pins of counter 600 to transition to low thereby causing ADC clock signal 504 to transition to low. Thus, ADC clock signal 504 transitions in a first direction when counter 600 reaches a first count and transitions in a second direction when counter 600 reaches a second count.

As binary counter 600 resets, output pins 616 and 610 both transition to low causing reset input 604 to transition to low, thereby allowing binary counter 600 to begin counting again. This process continues for a period of time resulting in a sequence of brief pulses in ADC clock signal 504. In particular, the pulses in ADC clock signal 504 are generated until reset circuit 228 transitions RESET signal 230 to low.

The frequency of the samples can be controlled by selecting various combinations of counter output pins to trigger the transitions in ADC clock signal 504. For a transmitter clock frequency of 1,843,200 Hz, the counter can be used to provide sampling frequencies of 48.5 KHz, 51.2 KHz, 36.9 KHz, 35.4 KHz, 24.9 KHz or 24.3 KHz in some embodiments.

An inverted version of RESET signal 230 formed by an inverter 624 is received by OR gate 622. Thus, when RESET signal 230 transitions to low, the input to OR gate 622 transitions to high causing reset input 604 of binary counter 600 to transition to high regardless of the count output by binary counter 600. This causes binary counter 600 to reset. At the same time, RESET signal 230 causes synch circuit 226 to transition START signal 224 to low so that binary counter 600 stops counting. As a result, when RESET signal 230 transitions to low, ADC clock signal 504 transitions to low and is held at low until transmitter clock signal 206 and receiver clock signal 208 are in phase again at which point START signal 224 transitions to high again causing binary counter 600 to start counting again.

When ADC 534 of FIG. 5 samples on a transition from low to high in ADC clock signal 504, the digital sample is obtained at the end of each clock cycle of ADC clock signal 504. Those skilled in the art will recognize that the digital sample can alternatively be taken at the beginning of the ADC clock signal by applying ADC clock signal 504 to additional circuit elements including OR gate 630, and inverters 632 and 634, which produce alternative ADC clock signal 636 that can be applied to ADC 534 in place of ADC clock signal 504. Inverter 632 receives START signal 224, which it inverts to provide an input to OR gate 630. OR gate 630's other input receives ADC clock signal 504. The output of OR gate 630 is input to inverter 634, which produces alternative ADC clock signal 636 at its output. Alternative ADC clock signal 636 transitions to high as soon as START signal 224 transitions to high and transitions to low briefly each time the count of counter 600 reaches a value where output pins 610 and 612 are both high.

Several factors lead to improved consistency using ADC clock generator 502. First, because ADC clock generator 502 is dedicated hardware, it does not suffer from inconsistent delays due to variations in interrupt handling and bus contention associated with shared hardware such as found in microcontroller unit 232. In addition, because a delayed version of transmitter clock 206 is used as the clocking signal for counter 600, ADC clock 504 transitions with a consistent delay after a transition in transmitter clock 206. Further, since START signal 224 transitions when transmitter clock 206 and receiver clock 208 are in phase, the transition in START signal 224 is in phase with transmitter clock 206. As a result, counter 600 starts counting at a consistent phase relative to the transition in START signal 224. This produces a consistent transition time for ADC clock 504 and thus a consistent sampling time relative to START signal 224 for ADC 534.

Figure 7:
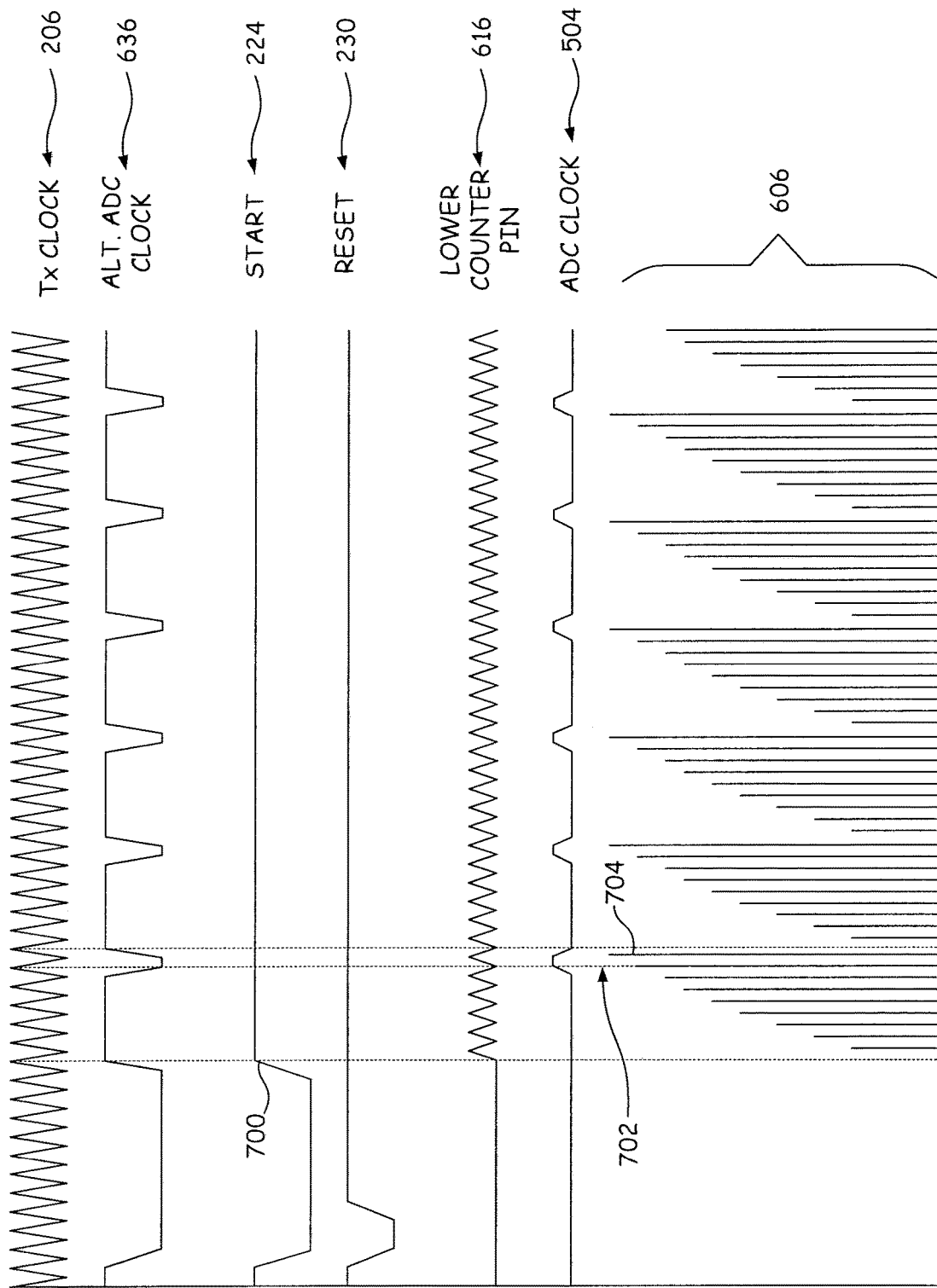
FIG. 7 is a timing graph of signals in the analog-to-digital converter clock generator of FIG. 6.

FIG. 7 shows timing diagrams for various signals and values in ADC clock generator 502. In particular, FIG. 7 provides graphs for transmitter clock 206, ADC clock signal 504, alternative ADC clock signal 636, START signal 224, RESET signal 230, output counter pin 616 and output count 606. As shown in FIG. 7, when START signal 224 transitions from low to high at point 700, the ADC clock sampling period begins as indicated by alternative ADC clock signal 636. When output count 606 reaches the count where output pins 610 and 612 are both high at time point 702, ADC clock signal 504 transitions from low to high and remains high for one cycle of counter pin 616. ADC clock signal 504 then transitions back to low at point 704. Note that the transitions from low to high in ADC clock signal 504 are aligned with a transition from low to high in transmitter clock 206.

Although the present invention has been described with reference to preferred embodiments, workers skilled in the art will recognize that changes may be made in form and detail without departing from the spirit and scope of the invention.

What is claimed is:

1. A level transmitter comprising:
an analog-to-digital converter clock signal generator that receives a transmitter clock signal and a start signal and uses the received transmitter clock signal to generate an analog-to-digital converter clock signal, where the transmitter clock signal is used to establish when an incident signal is transmitted toward a material boundary wherein the analog-to-digital converter clock signal generator comprises at least one logic gate and a counter, the at least one logic gate receiving the transmitter clock signal and the start signal and forming a counter clock signal that is provided to a clock input of the counter, the logic gate forming the counter clock signal such that the counter clock signal tracks the transmitter clock signal after a transition in the start signal;
an analog-to-digital converter that samples an analog waveform based on the analog-to-digital converter clock signal and generates a digital value for each sample of the analog waveform; and
an analysis module that analyzes the digital values to determine a distance to the material boundary.

2. The level transmitter of claim 1 wherein at least one transition in the transmitter clock signal causes the analog-to-digital clock signal to transition.

3. The level transmitter of claim 1 wherein the analog-to-digital clock signal transitions in a first direction when the counter reaches a first count and transitions in a second direction when the counter reaches a second count.

4. The level transmitter of claim 1 wherein the the counter clock signal begins to track the transmitter clock signal when a receiver clock signal and the transmitter clock signal are in phase.

5. A level transmitter comprising:
an incident signal generator that receives a transmitter clock signal and transmits an incident signal toward a material;
a dedicated analog-to-digital converter clock generator that receives the transmitter clock signal and a start signal, that generates a counter clock signal that tracks the transmitter clock signal after a transition in the start signal, and that uses the counter clock signal to drive a counter that generates an analog-to-digital converter clock signal;
a receiver that receives a reflected signal from the material and generates an analog signal from the reflected signal; and
an analog-to-digital converter that receives the analog-to-digital converter clock signal and produces digital samples of the analog signal based on the analog-to-digital converter clock signal.

6. The level transmitter of claim 5 wherein the analog-to-digital converter is implemented by a microcontroller unit.

7. The level transmitter of claim 5 wherein the counter clock signal begins to track the transmitter clock signal when the transmitter clock signal is in phase with a receiver clock signal.

8. The level transmitter of claim 7 wherein the counter is periodically reset based on a count value output by the counter.

* * * * *